(12) United States Patent
Kim (10) Patent No.: US 7,135,744 B2
(45) Date of Patent: Nov. 14, 2006

(54) SEMICONDUCTOR DEVICE HAVING SELF-ALIGNED CONTACT HOLE AND METHOD OF FABRICATING THE SAME

(75) Inventor: Hyoung-Sub Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 51 days.

(21) Appl. No.: 10/771,749

(22) Filed: Feb. 3, 2004

(65) Prior Publication Data

US 2004/0155282 A1    Aug. 12, 2004

(30) Foreign Application Priority Data

Feb. 11, 2003  (KR) ...................... 10-2003-0008629

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ................... 257/365; 257/382; 257/383
(58) Field of Classification Search ................ 257/365, 257/343, 382, 383
See application file for complete search history.

(56) References Cited

U.S. PATENT DOCUMENTS

| 5,817,562 | A  | * | 10/1998 | Chang et al. ................ 438/305 |
| 6,091,154 | A  | * | 7/2000  | Ohkawa ...................... 257/774 |
| 6,159,806 | A  |   | 12/2000 | Chern et al. ................. 438/275 |
| 6,649,503 | B1 | * | 11/2003 | Kim et al. ................... 438/595 |
| 6,864,580 | B1 | * | 3/2005  | Nakazawa et al. .......... 257/758 |
| 6,870,230 | B1 | * | 3/2005  | Matsuda et al. ............. 257/365 |

* cited by examiner

*Primary Examiner*—Phat X. Cao
(74) *Attorney, Agent, or Firm*—Marger Johnson & McCollom, P.C.

(57) ABSTRACT

According to embodiments of the invention, word line patterns are placed on a semiconductor substrate in a cell array region and at least one gate pattern is placed on the semiconductor substrate in a peripheral circuit region. Side walls of the word line patterns and the gate pattern are covered with word line spacers and gate spacers having the same width as that of the word line spacers, respectively. The semiconductor substrate having the word line spacers and the gate spacers is covered with an interlayer insulating layer. A self-aligned contact hole formed in the interlayer insulating layer penetrates a predetermined region between the word line patterns. The self-aligned contact hole is formed by etching the interlayer insulating layer and the word line spacers. The side walls of the self-aligned contact hole are covered with a self-aligned contact spacer having a width different from that of the gate spacers.

9 Claims, 5 Drawing Sheets

FIG. 6

SEMICONDUCTOR DEVICE HAVING SELF-ALIGNED CONTACT HOLE AND METHOD OF FABRICATING THE SAME

CROSS REFERENCE TO RELATED APPLICATIONS

This patent application claims priority from Korean Patent Application No. 10-2003-0008629 filed on Feb. 11, 2003, the contents of which are hereby incorporated by reference in their entirety.

BACKGROUND OF THE INVENTION

1. Field of the Invention

This disclosure relates to semiconductor devices and, more particularly, to a semiconductor device having self-aligned contact holes on a semiconductor substrate and a method of fabricating the same.

2. Description of the Related Art

With the increase of an integration density of semiconductor memory devices, including a DRAM, new technologies for fabricating them have been studied. A contact technology among them has become more important in fabrication of highly-integrated semiconductor devices.

Recently, a self-aligned contact technology has been widely used, which is suitable for fabricating highly-integrated semiconductor devices. A conventional process for fabricating the semiconductor devices using the self-aligned contact technology is as follows.

First, the conventional process includes providing a semiconductor substrate which has a cell array region and a peripheral circuit region. The cell array region and the peripheral circuit region have a plurality of word line patterns and at least one gate pattern, respectively. Each of word line patterns includes a word line and a capping insulating layer pattern stacked sequentially. The gate pattern also includes a gate electrode and a capping insulating layer pattern stacked sequentially.

The word line patterns and the gate pattern are used as ion implantation masks to implant impurity ions into the semiconductor substrate, and then to form low concentration source/drain regions in the semiconductor substrate. A spacer layer is formed on an upper surface of the semiconductor substrate having the low concentration source/drain regions. The spacer layer is anisotropically etched to form word line spacers and gate spacers on side walls of the word line patterns and on side walls of the gate pattern, respectively. The gate spacers are used in order to optimize a source/drain structure of a MOS transistor, that is, an LDD type source/drain structure formed in the peripheral circuit region. Accordingly, the width of the gate spacer maybe determined considering the MOS transistor characteristics.

The gate pattern and the gate spacers are used as ion implantation masks to implant impurity ions into the semiconductor substrate of the peripheral circuit region, and to form high concentration source/drain regions. As a result, the MOS transistors having the LDD type source/drain regions are formed in the peripheral circuit region.

An interlayer insulating layer is formed on an upper surface of the semiconductor substrate having the LDD type source/drain regions. The interlayer insulating layer is patterned to form a self-aligned contact hole penetrating a region between the word line patterns. In this case, the capping insulating layer patterns and the word line spacers function as etching stop layers when the self-aligned contact hole is formed.

According to the conventional self-aligned contact technology, each of the gate spacers has the same width as that of each of the word line spacers. Also, the gate spacers maybe formed to have a desired width in order to optimize the MOS transistor characteristics formed in the peripheral circuit region. For example, in case of decreasing the width of each of gate spacers, the source/drain region of the MOS transistor has an abrupt impurity profile such that the reliability of the MOS transistor, including a hot carrier effect, is deteriorated. On the contrary, if the width of the gate spacers is increased, the width of the word line spacers is also increased such that a lower diameter of the self-aligned contact hole is reduced. Accordingly, the increase of the width of the gate spacers brings about a self-aligned contact fail. Therefore, it is not easy to optimize the characteristics of the MOS transistor and the self-aligned contact.

On the other hand, U.S. Pat. No. 6,159,806 to Horng-Nan Chern (the '806 patent) discloses a method of increasing the width of a spacer. According to the '806 patent, the method includes forming gate patterns of an interior circuit and a peripheral circuit on the semiconductor substrate. N-type regions are formed in the semiconductor substrate having the gate patterns. Next, gate spacers are formed on side walls of the gate patterns. A first dielectric layer is formed on the semiconductor substrate having the gate spacers. A photoresist layer is coated on the semiconductor substrate having the first dielectric layer. The photoresist is patterned by using a photolithographic process to open semiconductor substrate having the gate pattern on the peripheral circuit. Next, N+ type impurity ions are implanted into the semiconductor substrate to form N+ type regions overlapping with an edge portion of the gate spacer. The photoresist layer is removed after the N+ type impurity ions are implanted into the semiconductor substrate. A second dielectric layer is formed on the semiconductor substrate having the N+ type regions. The first and second dielectric layers are sequentially etched to form contact holes in the two layers, which are aligned with the gate patterns of the interior circuit and the peripheral circuit. At this time, the N+ type regions are formed to overlap with the edges of the gate patterns of the peripheral circuit, by using the gate spacers and the first dielectric layer. Accordingly, with the first dielectric layer, an effective channel length can be increased by a thickness of the first dielectric layer under the gate pattern of the peripheral circuit.

However, the method provides that the contact hole formed between the gate patterns under the given state that pitch of the gate patterns is fixed in the interior circuit. Moreover, the contact hole is formed after the gate spacers have been formed on the side walls of the gate pattern. Accordingly, the above-described method can deteriorate the resistance of the contact holes if the design rule of the gate patterns is further reduced.

Embodiments of the invention address these and other disadvantages of the conventional art.

SUMMARY OF THE INVENTION

According to some embodiments of the invention, the width of a self-aligned contact spacer on a side wall of a self-aligned contact hole in a cell array region is unequal to a width of the word line spacers or the gate spacers. Thus, the contact resistance of the self-aligned contact hole may be properly controlled and the performance of the semiconductor device increased.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts.

DETAILED DESCRIPTION OF THE PREFERRED EMBODIMENT

Reference will now be made in detail to exemplary embodiments of a semiconductor device having a self-aligned contact hole and fabrication method thereof of the invention, which are illustrated in the accompanying drawings FIGS. 1 through 6 are cross-sectional views illustrating a semiconductor device and a method of fabricating the same according to some embodiments of the invention.

Figure 1:
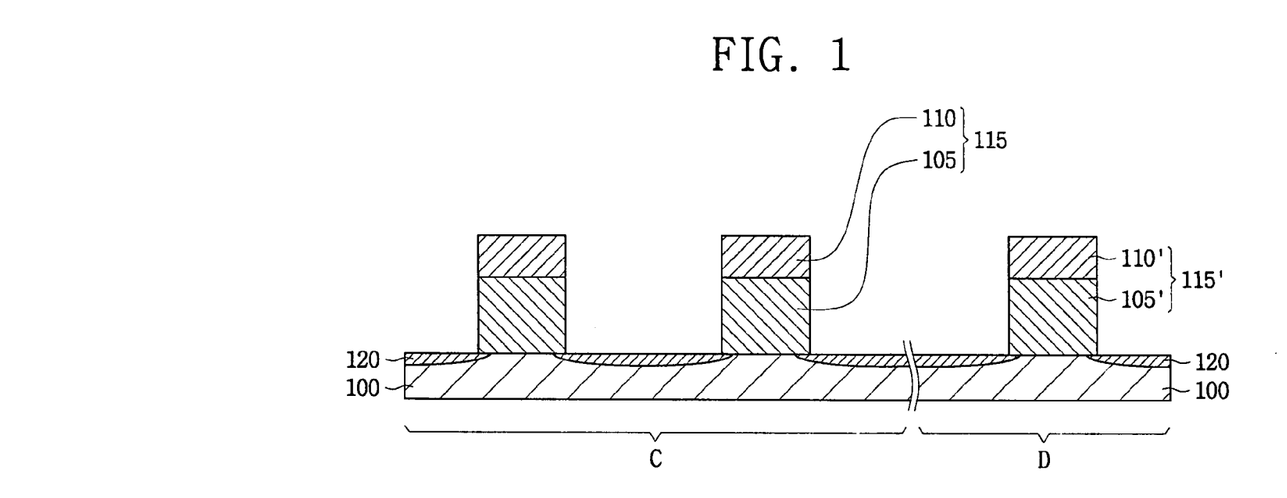
FIGS. 1 through 6 are cross-sectional views illustrating a semiconductor device and a method of fabricating the same according to some embodiments of the invention.

Referring to FIG. 1, a semiconductor substrate 100 having a cell array region C and a peripheral region D is provided. A gate conductive layer and a gate capping insulating layer (not shown) are sequentially formed on the semiconductor substrate 100. The gate conductive layer is preferably formed of a doped polysilicon layer. However, the gate conductive layer may be formed, for example, by sequentially stacking the doped polysilicon layer and a metal silicide layer. It is desirable that the gate capping insulating layer is formed of an insulating layer having an etch selectivity ratio to a silicon oxide layer, for example, a silicon nitride layer.

The gate capping insulating layer and the gate conductive layer are etched to form word line patterns 115 and at least one gate pattern 115' on the cell array region C and the peripheral circuit region D, respectively. As a result, each of the word line patterns 115 has a word line 105 and a word line capping layer 110, which are stacked sequentially, and the gate pattern 115' has a gate electrode 105' and a gate capping layer 110', which are stacked sequentially. The word line patterns 115 and the gate pattern 115' is used as ion implantation masks to implant impurity ions into the semiconductor substrate 100, and to form N− type low concentration source/drain regions 120.

Figure 2:
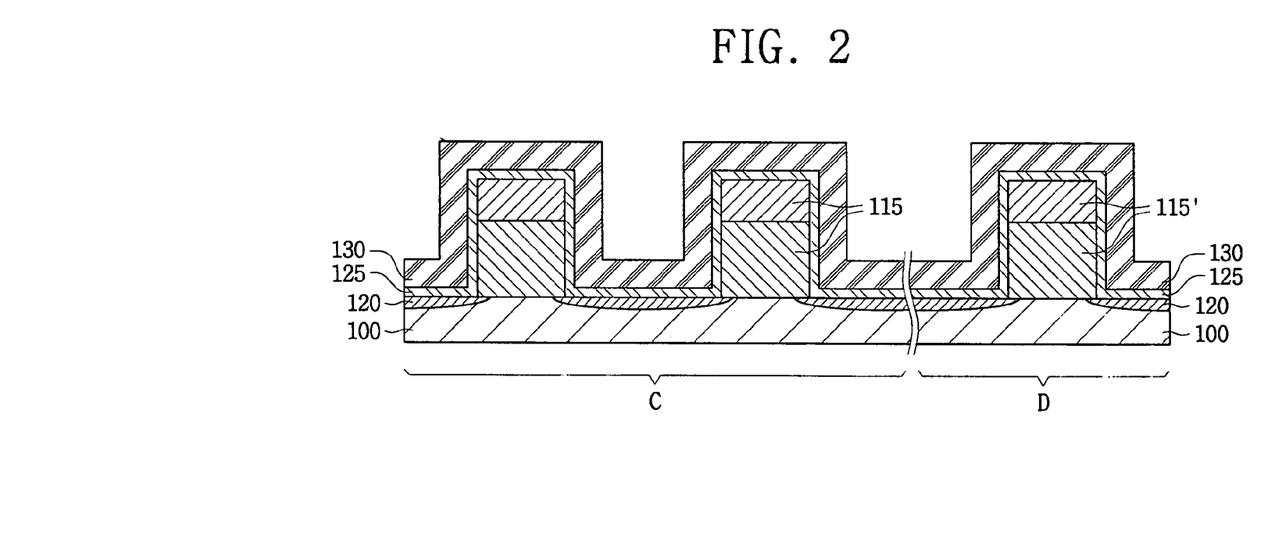

Referring to FIG. 2, a spacer insulating layer 130 is formed on an upper surface of the semiconductor substrate having word line patterns 115 of the cell array region C and a gate pattern 115' of the peripheral circuit region D. It is desirable to form the spacer insulating layer 130 of an oxide layer. Before the spacer insulating layer 130 is formed, a process of forming a spacer etch stop layer 125 may be further included. The spacer etch stop layer 125 is formed of an insulating layer having an etch selectivity ratio different from that of an oxide layer. It is desirable to form the spacer etch stop layer 125 from a nitride layer.

Figure 3:
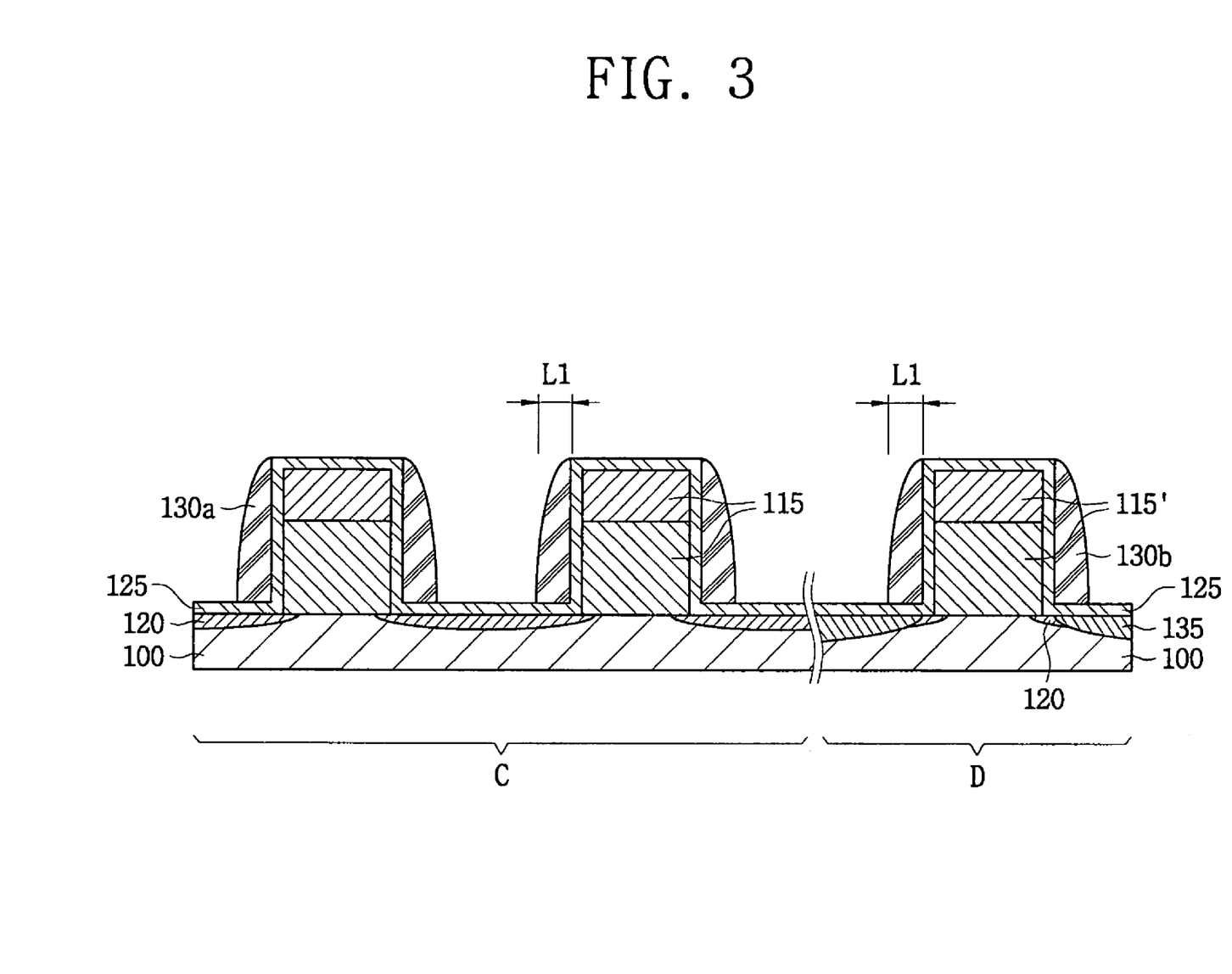

Referring to FIG. 3, the spacer insulating layer 130 is etched back to form word line spacers 130a on side walls of the word line patterns 115, and at the same time, to form gate spacers 130b on side walls of the gate pattern 115'. Preferably, the word line spacers 130a and the gate spacers 130b are formed to have the same width L1. The gate spacers 130b are used to enhance a characteristic of a transistor on the peripheral circuit region D.

A photoresist layer (not shown) is coated on the semiconductor substrate 100 having the word line spacers 130a and the gate spacers 130b. A photolithographic process is carried out in the photoresist layer to expose the peripheral circuit region D. Next, the gate spacers 130b and the spacer etch stop layer 125 are used as ion implantation masks to implant N+ type impurity ions in the semiconductor substrate 100 to form N+ type regions 135 in the peripheral circuit region D. The N+ type regions 135 form a LDD (Lightly Doped Drain) structure together with N− type regions 120 overlapping edge regions of the gate pattern 115'. After the N+ type regions 135 are formed in the peripheral circuit region D, the photoresist layer is removed.

In one aspect of the present invention, the spacer insulating layer 130 may be etched back anisotropically by using the spacer etch stop layer 125 as a buffer layer.

Figure 4:
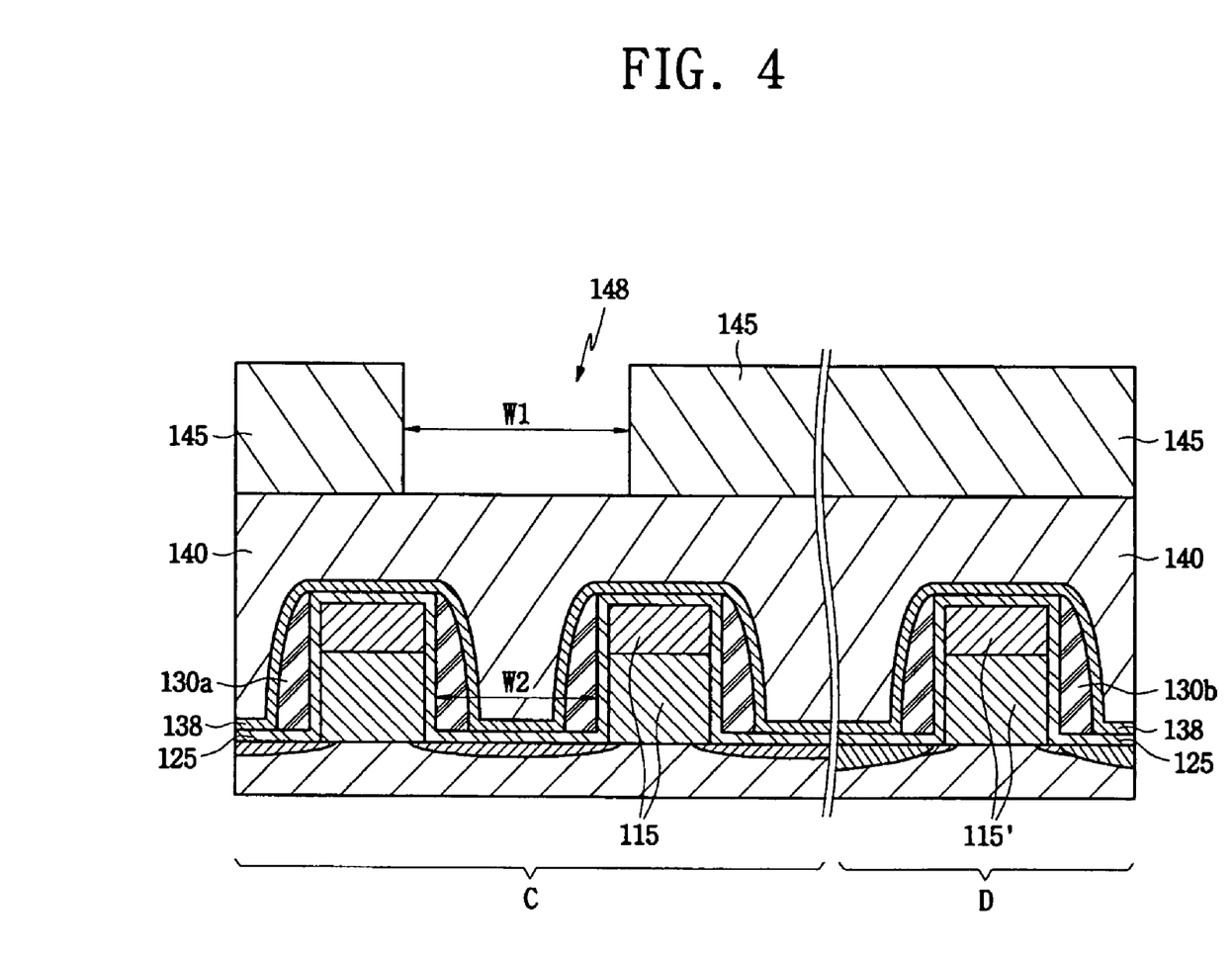

Referring to FIG. 4, an interlayer insulating layer 140 is conformally formed on the upper surface of the semiconductor substrate having the word line spacers 130a and the gate spacers 130b. Before the interlayer insulating layer 140 is formed, a contact etch stop layer 138 may be further included.

A photoresist layer 145 is coated on the interlayer insulating layer 140. A photolithographic process is carried out to form at least one photoresist pattern 148 on the cell array region C. The photoresist pattern 148 is aligned between word line patterns 115. Also, the photoresist patterns 148 are formed to have a desired width W1 greater than a width W2 between the word line patterns 115 on the interlayer insulating layer 140, in consideration of a mis-alignment during the photolithographic process. The interlayer insulating layer 140 may be one selected from a high-density plasma (HDP) oxide layer, an undoped silicon glass (USG) layer, a borophosphosilicate glass (BPSG) layer, and a phosphosilicate glass (PSG) layer.

The contact etch stop layer 138 and the spacer etch stop layer 125 are preferably not used simultaneously in the same process.

Figure 5:
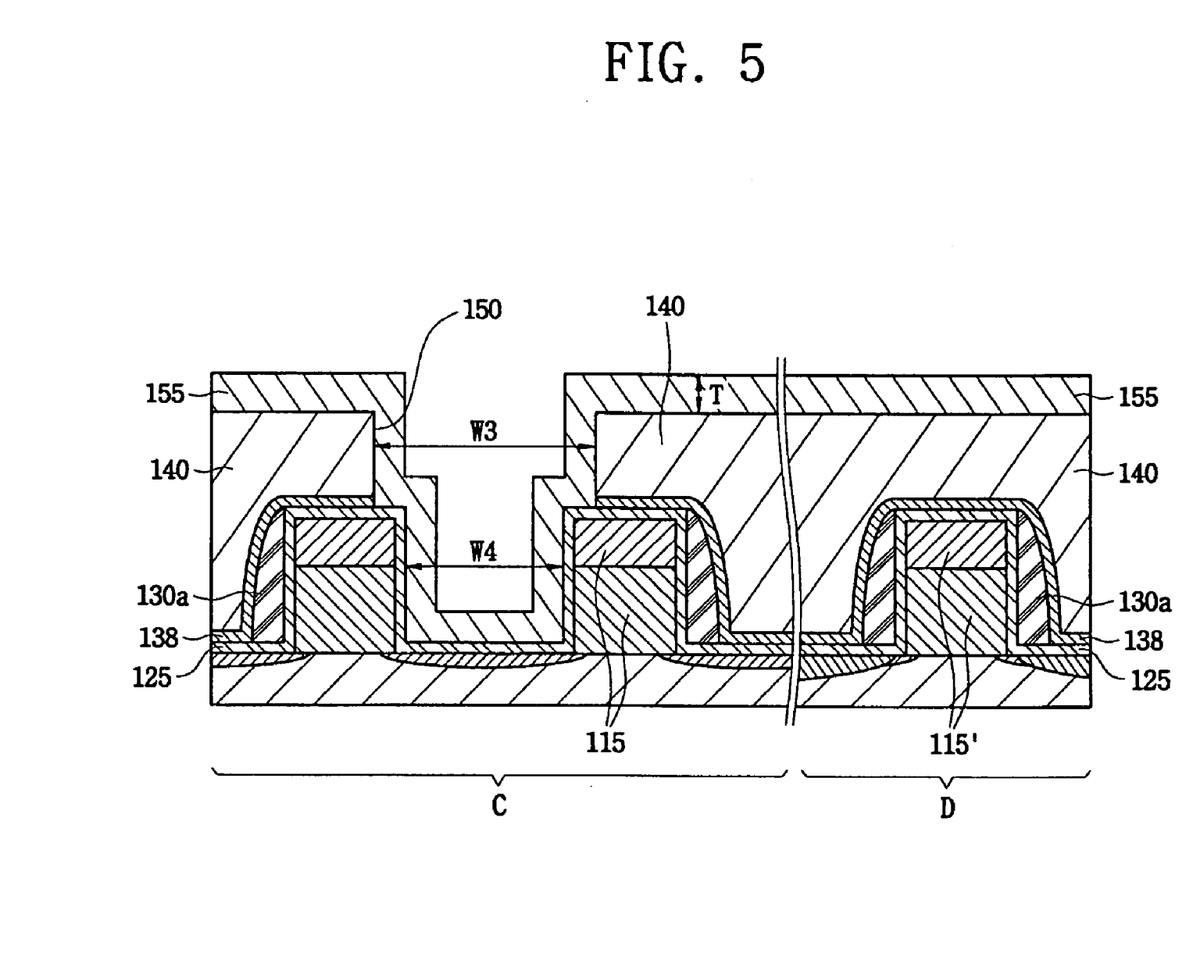

Referring to FIG. 5, the photoresist layer 145 is used as an etching stop layer to etch the interlayer insulating layer 140 through the photoresist pattern 148. At this time, at least one self-aligned contact hole 150 is formed in the interlayer insulating layer 140 corresponding to the photoresist pattern 148. The self-aligned contact hole 150 penetrates a predetermined region between the word line patterns 115. Here, the interlayer insulating layer 140 and the word line spacers 130a in the self-aligned contact hole 150 are removed to expose the semiconductor substrate 100.

The self-aligned contact hole 150 is formed self-aligned with the word line patterns 115. The self-aligned contact hole 150 includes a lower contact hole formed at a predetermined region between the word line patterns 115, and an upper contact hole formed to penetrate the interlayer insulating layer 140 and the contact etch stop layer 138 and positioned above the lower contact hole. The diameter of the upper contact hole, W3, is greater than that of the lower contact hole, W4, in the direction across the word line patterns 115.

However, the interlayer insulating layer 140 in the peripheral circuit region D is not etched due to the photoresist layer 145 shown in FIG. 4. Therefore, the width of the gate spacers 130b in the peripheral circuit region D are kept substantially the same size as that shown in FIG. 3. After the self-aligned contact hole 150 is formed, the photoresist layer 145 on the interlayer insulating layer 140 is removed.

Subsequently, a self-aligned insulating layer 155 having a predetermined thickness T is conformally formed on an upper surface of the semiconductor substrate having the self-aligned contact hole 150. The self-aligned insulating layer 155 has an etch selectivity ratio different from that of the interlayer insulating layer 140. It is desirable that the self-aligned insulating layer 155 is preferably formed of an oxide layer or a nitride layer.

If a spacer etch stop layer 125 or a contact etch stop layer 138 is used when the self-aligned contact hole 150 is formed, each of etch stop layers 125, 138 functions as a buffer layer to reduce etching damage. Here, the spacer etch stop layer 125 functions as the buffer layer to reduce the etching damage to the semiconductor substrate 100 while the interlayer insulating layer 140 and the word line spacer 130a are removed. Also, the contact etch stop layer 138 functions as the buffer layer against the etching while the interlayer insulating layer 140 is removed, and reduces an etching burden to etch the word line spacer 130a in the following process.

Figure 6:
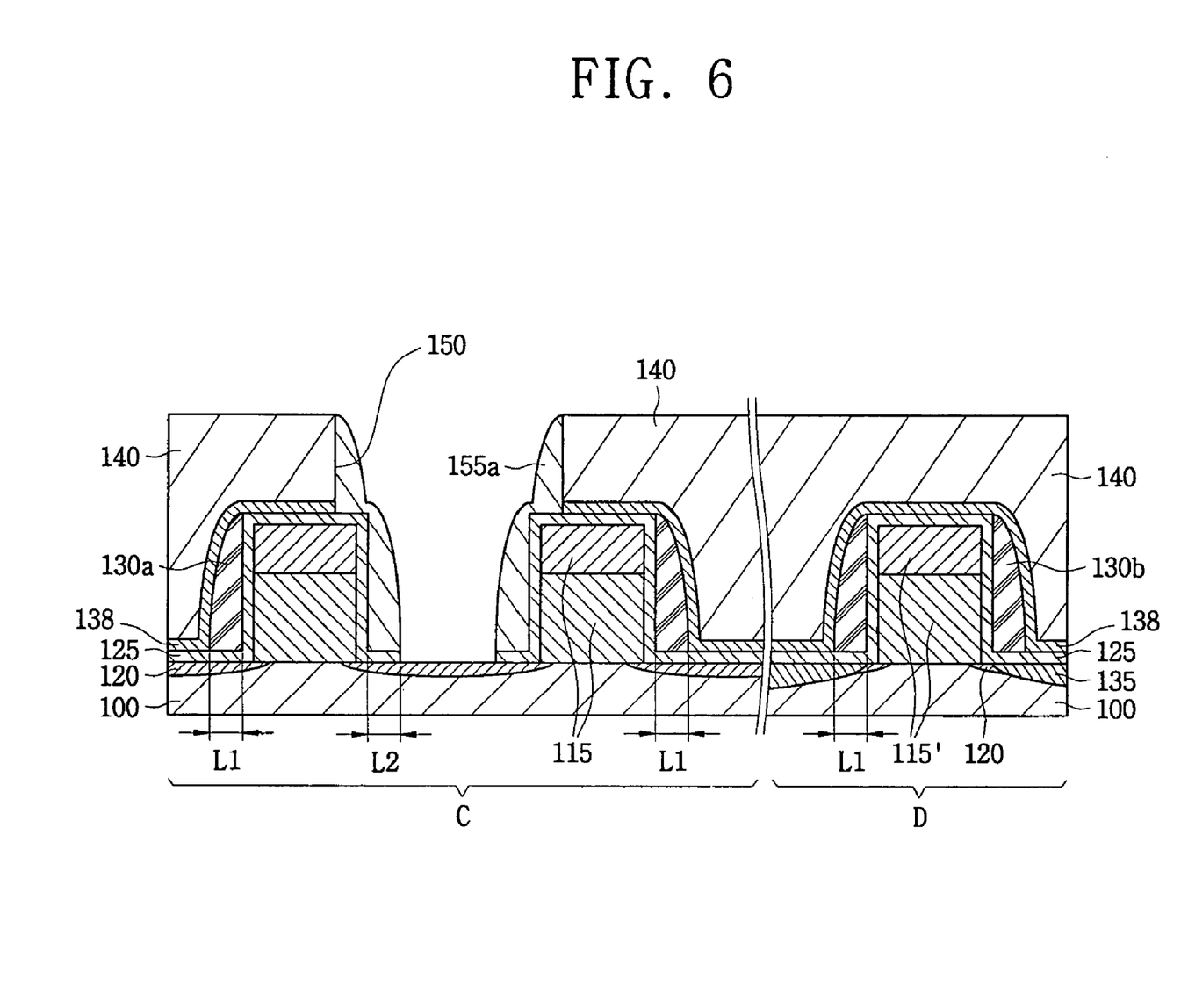

Referring to FIG. 6, the self-aligned insulating layer 155 is etched back to form a self-aligned contact spacer 155a on the side wall of the self-aligned contact hole 150. The width L2 of the self-aligned contact spacer 155a maybe controlled to be different from the widths W1 of the word line spacers 130a formed on the cell array region C. The width L2 of the self-aligned contact spacer 155a maybe controlled to be different from the width L1 of the gate spacers 130b formed in the peripheral circuit region D. The width L2 of the self-aligned contact spacer 155a may be less than the width L1 of the word line spacers 130a or the width L1 of the gate spacers 130b.

Accordingly, in the semiconductor device according to some embodiments of the invention, an exposed region of the semiconductor substrate 100 in the self-aligned contact hole 150 can be properly controlled by using the self-aligned contact spacer 155a. That is, in the semiconductor device having the self-aligned contact spacer 155a, it is available to properly control an area of the semiconductor substrate 100 exposed in the self-aligned contact hole 150 that is subject to a reduced design rule. This is because the width L2 of the self-aligned contact spacer 155a can be formed to be different from the width L1 of the word line spacers 130a or the width L1 of the gate spacers 130b. Also, the semiconductor device can properly control contact resistance of the self-aligned contact hole 150. Therefore, a loss of data inputted or outputted to the cell array region C can be reduced.

The self-aligned contact spacer 155a may also be formed by using the spacer etch stop layer 125 or the contact etch stop layer 138. At this time, the spacer etch stop layer 125 may be interposed between the word line patterns 115 and the word line spacers 130a, between the word line patterns 115 and the interlayer insulating layer 140, and between the word line patterns 115 and the self-aligned contact spacer 155a in the cell array region C. Also, the spacer etch stop layer 125 may be interposed between the gate pattern 115' and the gate spacers 130b, and between the gate pattern 115' and the interlayer insulating layer 140 in the peripheral circuit region D. And the spacer etch stop layer 125 can be used as a buffer layer against the etching while the self-aligned contact spacer 155a is formed. So, an etching damage to the semiconductor substrate 100 can be reduced. After the self-aligned contact spacer 155a is formed, the self-aligned contact hole 150 is formed by etching the spacer etch stop layer 125 continuously to expose the semiconductor substrate 100.

The contact etch stop layer 138 is interposed between the word line spacers 130a and the interlayer insulating layer 140, and between the word line patterns 115 and the interlayer insulating layer 140 in the cell array region C. Also, the contact etch stop layer 138 is interposed between the gate spacer 130b and the interlayer insulating layer 140, and between the gate pattern 115' and the interlayer insulating layer 140 in the peripheral circuit region D.

A semiconductor device having a self-aligned contact hole according to embodiments of the invention will now be described with reference to FIG. 6. The semiconductor device includes a semiconductor substrate having a cell array region C and a peripheral circuit region D. A plurality of word line patterns 115 are disposed on the semiconductor substrate 100 in the cell array region C, and at least one gate pattern 115' is disposed on the semiconductor substrate 100 in the peripheral circuit region D. An upper surface of the semiconductor substrate having the word line patterns 115 and the gate pattern 115' is covered with an interlayer insulating layer 140. A predetermined region of the semiconductor substrate 100 between the word line patterns 115 is exposed to a self-aligned contact hole 150 which penetrates the interlayer insulating layer 140. A side wall of the self-aligned contact hole 150 is covered with a self-aligned contact spacer 155a. Also, a side wall of the gate pattern 115' is covered with gate spacers 130b. The self-aligned contact spacer 155a has a width different from that of the gate spacers 130b. Preferably, the width of the self-aligned contact spacer 155a is less than that of the gate spacers 130b.

Additionally, side walls of the word line patterns 115 placed opposite to the self-aligned contact hole 150 are covered with word line spacers 130a. The word line spacers 130a have the same width as that of the gate spacers 130b. Moreover, a spacer etch stop layer 125 can be interposed between the spacers 130a or the spacers 155a and the side walls of the word line patterns 115. The spacer etch stop layer 125 is extended to cover upper surfaces and side walls of the gate pattern 115'. Also, a contact etch stop layer 138 can be interposed between the spacers 130a and 130b and the interlayer insulating layer 140.

On the other hand, the self-aligned contact hole 150 includes a lower contact hole formed at a region between the word line patterns 115, and an upper contact hole positioned above the lower contact hole and formed to penetrate the interlayer insulating layer 140. In the direction across the word line patterns 115, the diameter of the upper contact hole may be greater than that of the lower contact hole.

As described above, in the semiconductor device having a self-aligned contact hole and the method of fabricating the same according to embodiments of the invention, the width of the self-aligned contact spacer on the side wall of the self-aligned contact hole in the cell array region is formed to be different from that of the word line spacers or the gate spacers so that the contact resistance of the self-aligned contact hole may be properly controlled and the performance of the semiconductor device increased.

Embodiments of the invention will now be described in a non-limiting way.

Embodiments of the invention provide a semiconductor device having a self-aligned contact hole suitable for easily controlling contact resistance in a cell array region and a method of fabricating the same.

According to some embodiments of the invention, there is provided a semiconductor device that includes a plurality of word line patterns and at least one gate pattern placed on a cell array region and a peripheral region of the semiconductor substrate. An upper surface of the semiconductor substrate is covered with an interlayer insulating layer. A self-aligned contact hole is placed in the interlayer insulating layer to penetrate a predetermined region between the word line patterns. The side wall of the self-aligned contact hole is covered with a self-aligned contact spacer. Gate spacers are interposed between side walls of the gate pattern and the interlayer insulating layer, and the width of the gate spacers is different from that of the self-aligned contact spacer.

According to some embodiments of the invention, the semiconductor device further includes word line spacers interposed between side walls of the word line patterns placed opposite to the self-aligned contact hole and the interlayer insulating layer, the word line spacers being formed of the same material layer as the gate spacer, the word line spacers having the same width as that of the gate spacers.

In accordance with other embodiments of the invention, the semiconductor device further may include a spacer etch stop layer interposed between the word line spacers and the word line patterns, between the gate spacers and the gate pattern, and between the self-aligned contact spacer and the word line patterns.

In accordance with other embodiments of the invention, the semiconductor device may further include contact etch stop layers interposed between the word line spacers and the interlayer insulating layer, and also between the gate spacers and the interlayer insulating layer.

In accordance with some embodiments of the invention, there is provided a method of fabricating a semiconductor device that includes forming a plurality of word line patterns and at least one gate pattern on the semiconductor substrate of a cell array region and a peripheral region, respectively. Word line spacers and gate spacers are formed on side walls of the word line patterns and side walls of the gate pattern, respectively. An interlayer insulating layer is formed on an upper surface of the semiconductor substrate. The interlayer insulating layer and the word line spacers are sequentially etched to form a self-aligned contact hole penetrating a predetermined region between the word line patterns. The self-aligned contact spacer is formed on the side wall of the self-aligned contact hole, the width of which are different from that of the gate spacers.

In accordance with other embodiments of the invention, the method for fabricating the semiconductor device may further include forming a spacer etch stop layer on the upper surface of the semiconductor substrate having the word line patterns and at least one gate pattern, before forming the word line spacers and the gate spacers. The space etch stop layer functions as a buffer layer against an etching while the self-aligned contact hole or the self-aligned contact spacer is formed.

In accordance with other embodiments of the invention, the method for fabricating the semiconductor device may further include, before forming the interlayer insulating layer, forming a contact etch stop layer on the upper surface of the semiconductor substrate having the word line spacers and the gate spacers. The contact etch stop layer functions as a buffer layer against etching while the self-aligned contact hole is formed.

While the invention has been particularly shown and described with reference to exemplary embodiments thereof, it will be understood by those skilled in the art that the foregoing and other changes in form and details may be made therein without departing from the spirit and scope of the invention as defined in the following claims.

The invention claimed is:

1. A semiconductor device comprising:
   a semiconductor substrate having a cell array region and a peripheral circuit region;
   a plurality of word line patterns placed on the cell array region, the word line patterns including a word line and a word line capping layer;
   at least one gate pattern placed on the peripheral circuit region;
   an interlayer insulating layer covering an upper surface of the semiconductor substrate having the word line patterns and the at least one gate pattern;
   a self-aligned contact hole formed in the interlayer insulating layer between the word line patterns;
   a self-aligned contact spacer covering a side wall of the self-aligned contact hole;
   gate spacers interposed between side walls of the at least one gate pattern and the interlayer insulating layer, a width of the gate spacers being substantially different from a width of the self-aligned contact spacer;
   word line spacers interposed between side walls of the word line patterns placed opposite to the self-aligned contact hole and the interlayer insulating layer, the word line spacers being formed of the same material layer as the gate spacer, a maximum width of the word line spacers substantially the same as a maximum width of the gate spacers; and
   a spacer etch stop layer disposed in contact with the word line spacers and the word line patterns in the cell array region, disposed in contact with the gate spacers and the at least one gate pattern in the peripheral circuit region, and disposed in contact with the self-aligned contact spacer and the word line patterns in the cell array region.

2. The semiconductor device according to claim 1, further comprising:
   a contact etch stop layer disposed in contact with the word line spacers and the interlayer insulating layer in the cell array region, and disposed in contact with the gate spacers and the interlayer insulating layer in the peripheral circuit region.

3. The semiconductor device according to claim 1, wherein the interlayer insulating layer is one selected from the group consisting of an HDP oxide layer, a USG layer, and a PSG layer.

4. The semiconductor device according to claim 1, the self-aligned contact hole comprising a lower contact hole and an upper contact hole, the lower contact hole formed at a region between the word line patterns and having a first diameter, the upper contact hole placed on the lower contact hole, disposed to penetrate the interlayer insulating layer, and having a second diameter that is unequal to the first diameter.

5. The semiconductor device according to claim 4, the second diameter greater than the first diameter in a direction across the word line patterns.

6. The semiconductor device according to claim 1, wherein the width of the self-aligned contact spacer is smaller than the width of the gate spacers.

7. A device comprising:
   at least two word line patterns in a cell array region of a semiconductor substrate;
   at least one gate pattern in a peripheral circuit region of the semiconductor substrate;
   an inter-layer insulating layer covering the semiconductor substrate, the at least two word line patterns, and the at least one gate pattern, the at least one gate pattern including a gate spacer, the gate spacer disposed entirely between a sidewall of the at least one gate pattern and the inter-layer insulating layer;
   a self-aligned contact hole penetrating the inter-layer insulating layer between the at least two word line patterns;

a self-aligned contact spacer on a sidewall of the self-aligned contact hole, a width of the self-aligned contact spacer unequal to a width of the gate spacer;

a word line spacer between one of the at least two word line patterns and the interlayer insulating layer, the word line spacer formed of the same material and having the same width as the gate spacer; and a spacer etch stop layer disposed in contact with the word line spacer and one of the at least two word line patterns, disposed in contact with the gate spacer and the at least one gate pattern, and disposed in contact with the self-aligned contact spacer and the at least two word line patterns.

8. The semiconductor device according to claim 7, further comprising:

a contact etch stop layer between the at least two word line spacers and the inter-layer insulating layer, and between the gate spacer and the inter-layer insulating layer.

9. The semiconductor device according to claim 7, the self-aligned contact hole comprising:

a lower contact hole; and an upper contact hole, a diameter of the upper contact hole greater than a diameter of the lower contact hole in a direction perpendicular to the at least two word line patterns.

* * * * *